United States Patent
Park

(10) Patent No.: US 7,799,631 B2
(45) Date of Patent: Sep. 21, 2010

(54) MULTIPLE-LAYER DIELECTRIC LAYER AND METHOD FOR FABRICATING CAPACITOR INCLUDING THE SAME

(75) Inventor: Jong-Bum Park, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 123 days.

(21) Appl. No.: 11/753,541

(22) Filed: May 24, 2007

(65) Prior Publication Data

US 2008/0160712 A1    Jul. 3, 2008

(30) Foreign Application Priority Data

Dec. 27, 2006  (KR)  .................. 10-2006-0134352

(51) Int. Cl.
- H01L 21/8242  (2006.01)
- H01L 27/108  (2006.01)
- H01L 29/94  (2006.01)
- H01L 21/02  (2006.01)

(52) U.S. Cl. .................. 438/240; 257/310; 257/E21.01

(58) Field of Classification Search .................. 438/240; 257/310

See application file for complete search history.

(56) References Cited

U.S. PATENT DOCUMENTS

2006/0097305 A1*  5/2006  Lee .............................. 257/310

FOREIGN PATENT DOCUMENTS

| KR | 1020040060443 A | 7/2004 |
| KR | 1020060052474 A | 5/2006 |
| KR | 100596805 B1 | 6/2006 |
| KR | 1020060102470 A | 9/2006 |

* cited by examiner

*Primary Examiner*—Savitri Mulpuri
*Assistant Examiner*—Calvin Choi
(74) *Attorney, Agent, or Firm*—Townsend and Townsend and Crew LLP

(57) ABSTRACT

A dielectric layer of a capacitor includes a first dielectric layer, a second dielectric layer formed over the first dielectric layer, the second dielectric layer having a dielectric constant lower than that of the first dielectric layer, and a third dielectric layer formed over the second dielectric layer, the third dielectric layer having a dielectric constant higher that of than the second dielectric layer, wherein the third dielectric layer has a greater thickness than each of the first and second dielectric layers.

19 Claims, 8 Drawing Sheets

A

MULTIPLE-LAYER DIELECTRIC LAYER AND METHOD FOR FABRICATING CAPACITOR INCLUDING THE SAME

CROSS-REFERENCE TO RELATED APPLICATIONS

The present invention claims priority of Korean patent application number 10-2006-0134352, filed on Dec. 27, 2006 which is incorporated by reference in its entirety.

BACKGROUND OF THE INVENTION

The present invention relates to a method for fabricating a semiconductor device, and more particularly, to a method for fabricating a dielectric layer and a method for fabricating a capacitor.

As the design rule of dynamic random access memories (DRAM) has decreased, high-k dielectric materials [e.g., zirconium oxide ($ZrO_2$)] have been used instead of the typical oxide/nitride/oxide (ONO) or aluminum oxide ($Al_2O_3$) in order to maintain a desired memory capacitance. Solely using the high-k dielectric materials may cause a limitation related to a leakage current characteristic. Thus, a crystalline high-k dielectric material and $Al_2O_3$, which is an amorphous low-k dielectric material, are mixed to form a structure of "high-k dielectric material/$Al_2O_3$/high-k dielectric material." Thus, the capacitance and the leakage current characteristics may be satisfied. At this time, the high-k dielectric material is formed at a low temperature and the $Al_2O_3$ is formed at a high temperature to improve the capacitance.

FIG. 1 illustrates a cross-sectional view of a structure of a typical cylinder type capacitor. A dielectric layer 12 is formed over cylinder type storage electrodes 11. The dielectric layer 12 includes a first $ZrO_2$ layer 12A, an $Al_2O_3$ layer 12B, and a second $ZrO_2$ layer 12C, formed in sequential order. At this time, the $Al_2O_3$ layer 12B is formed with a small thickness to improve a dielectric constant characteristic.

However, a spacing distance between the adjacent storage electrodes 11 becomes small due to the large scale of integration in the typical cylinder type capacitor. Thus, the adjacent storage electrodes 11 may become electrically connected while the $Al_2O_3$ layer 12B is formed at a high temperature, generating a dual bit failure in a reliability assessment.

FIGS. 2A and 2B illustrate a cross-sectional view and a micrographic view, respectively, of a typical result after an $Al_2O_3$ layer is formed. According to the typical method, the $Al_2O_3$ layer 12B is formed at a temperature of approximately 400° C. or higher after the first $ZrO_2$ layer 12A is formed. At this time, the first $ZrO_2$ layer 12A and the $Al_2O_3$ layer 12B may fill a gap (refer to reference denotation 'G') between the adjacent cylinder type storage electrodes 11 and stick together. In this case, the subsequent second $ZrO_2$ layer 12C, functioning as a third dielectric layer, may not be formed in the small gap between the adjacent cylinder type storage electrodes 11.

For instance, in a case of forming the first and second $ZrO_2$ layers 12A and 12C to substantially the same thickness ranging from approximately 50 Å to approximately 55 Å, the cylinder type storage electrodes 11 are isolated by the first $ZrO_2$ layer 12A ranging from approximately 100 Å to approximately 110 Å and the $Al_2O_3$ layer 12B having a small thickness ranging from approximately 3 Å to approximately 10 Å after the $Al_2O_3$ layer 12B is formed. Thus, the dual bit failure may be generated when a bias increases. That is, a dielectric layer having a small thickness of approximately 120 Å may not be sufficient to reduce electrical connection between adjacent cylinder type bottom electrodes.

Referring to FIG. 2B, in a storage electrode structure disposed in zigzag pattern, adjacent cylinders are stuck together where a spacing distance is small between storage electrodes. That is, a bridge (refer to 'A') is observed.

SUMMARY OF THE INVENTION

Embodiments of the present invention relate to a method for fabricating a dielectric layer and a capacitor. The dielectric layer may reduce a generation of bridges between storage electrodes generally occurring when a high-k dielectric material and a low-k dielectric material are mixed. At the same time, the dielectric layer may reduce leakage current and secure a high dielectric constant.

In accordance with an aspect of the present invention, there is provided a dielectric layer of a capacitor, including: a first dielectric layer; a second dielectric layer formed over the first dielectric layer, the second dielectric layer having a dielectric constant lower than that of the first dielectric layer; and a third dielectric layer formed over the second dielectric layer, the third dielectric layer having a dielectric constant higher that of than the second dielectric layer, wherein the third dielectric layer has a greater thickness than each of the first and second dielectric layers.

In accordance with another aspect of the present invention, there is provided a method for fabricating a dielectric layer of a capacitor, including: forming a first dielectric layer; forming a second dielectric layer over the first dielectric layer, the second dielectric layer having a dielectric constant lower than that of the first dielectric layer; and forming a third dielectric layer over the second dielectric layer, the third dielectric layer having a dielectric constant higher that of than the second dielectric layer, wherein the third dielectric layer is thicker than each of the first and second dielectric layers.

In accordance with still another aspect of the present invention, there is provided a method for fabricating a capacitor, including: forming a storage electrode; forming a first dielectric layer over the storage electrode; forming a second dielectric layer over the first dielectric layer, the second dielectric layer having a dielectric constant lower than that of the first dielectric layer; forming a third dielectric layer over the second dielectric layer, the third dielectric layer having a dielectric constant higher than that of the second dielectric layer and having a thickness greater than that of each of the first and second dielectric layers; and forming a plate electrode over the third dielectric layer.

DESCRIPTION OF SPECIFIC EMBODIMENTS

Figure 1:
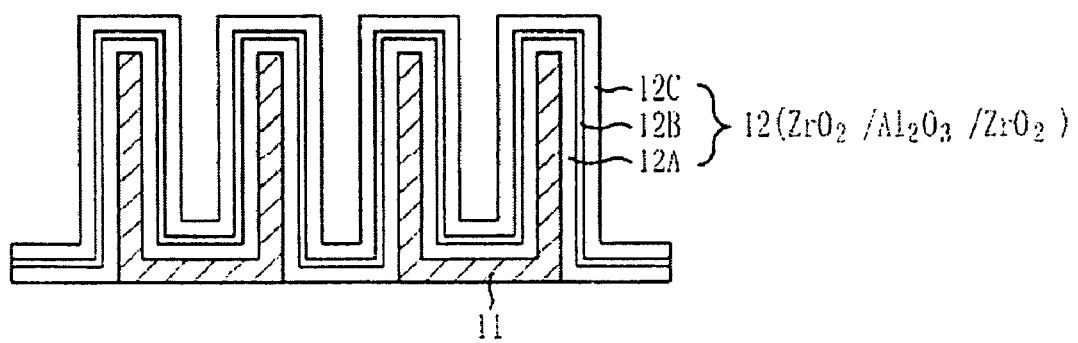
FIG. 1 illustrates a cross-sectional view of a structure of a typical cylinder type capacitor.
Figure 2A:
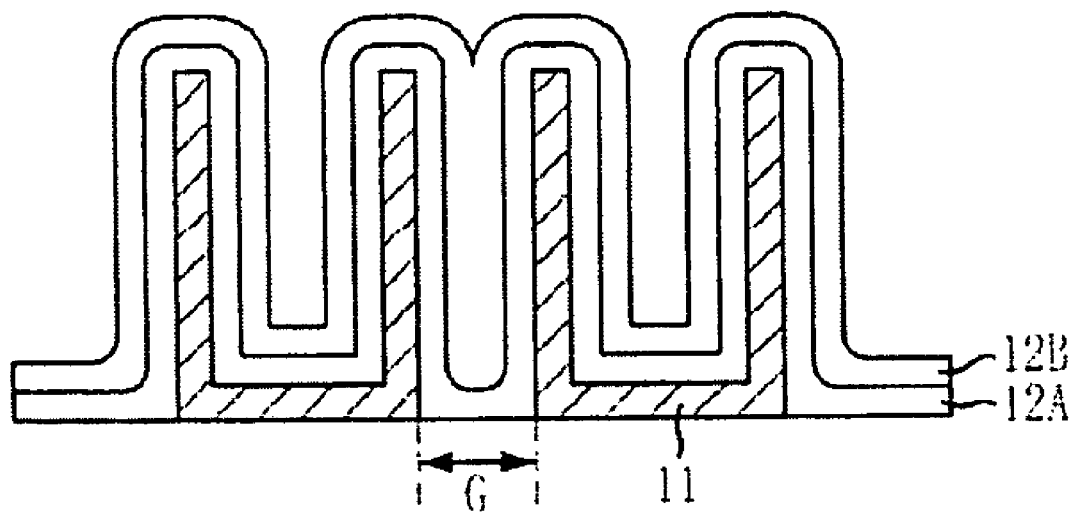
FIGS. 2A and 2B illustrate a cross-sectional view and a micrographic view, respectively, of a typical result after an aluminum oxide ($Al_2O_3$) layer is formed.
Figure 2B:
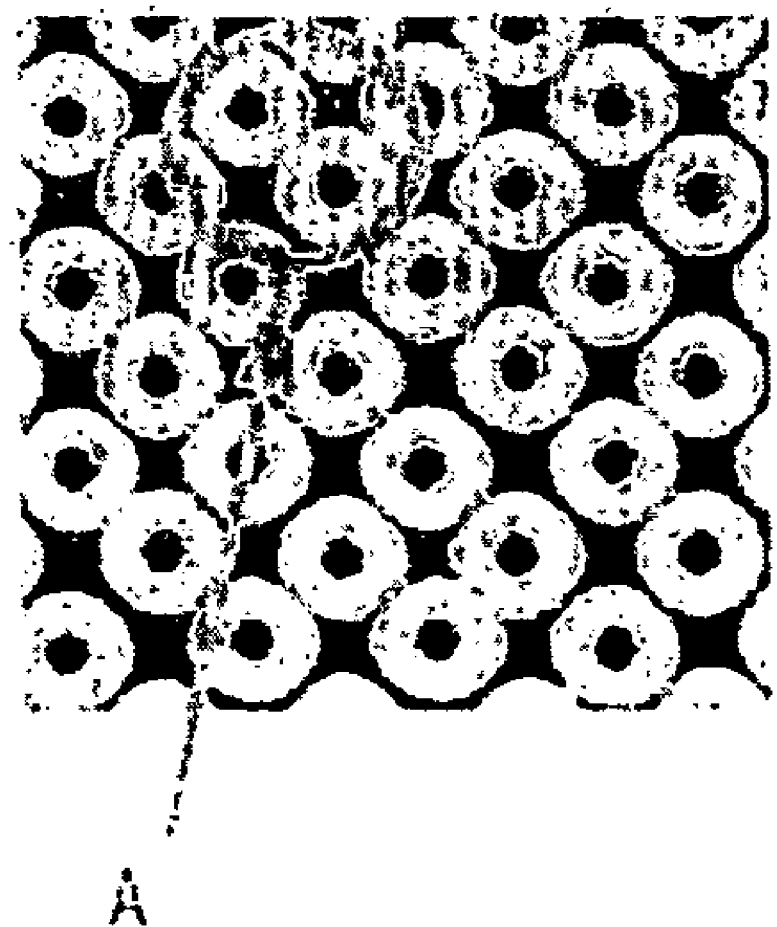

The present invention relates to a multiple-layer dielectric layer and a method for fabricating a capacitor including the same. According to embodiments of the present invention, a dielectric layer may prevent dual bit failures and may obtain a high capacitance when forming the dielectric layer including a high-k dielectric material/low-k dielectric material/high-k dielectric material structure. Such a dielectric layer may be obtained by controlling a feeding time of a reaction gas of the high-k dielectric material, a thickness of each layer, and a deposition temperature of each layer, even when a spacing distance between adjacent storage electrodes becomes small.

According to other embodiments of the present invention, a step coverage characteristic may improve because the high-k dielectric material is formed at a low temperature.

According to other embodiments of the present invention, an excessive crystallization of the high-k dielectric material formed below the low-k dielectric material may be avoided by decreasing the deposition temperature of the low-k dielectric material.

According to other embodiments of the present invention, a feeding time of a reaction gas of the high-k dielectric material is increased to improve layer property deteriorated by a low deposition temperature, and crystalline property of the high-k dielectric material is improved to increase a dielectric constant.

According to other embodiments of the present invention, a thickness of the high-k dielectric material contacting a plate electrode is increased to improve a leakage current characteristic and a crystalline property of the high-k dielectric material. Thus, the dielectric constant may be increased.

The same or like reference numerals through out the various embodiments of the present invention represent the same or like elements in different drawings.

Figure 3:
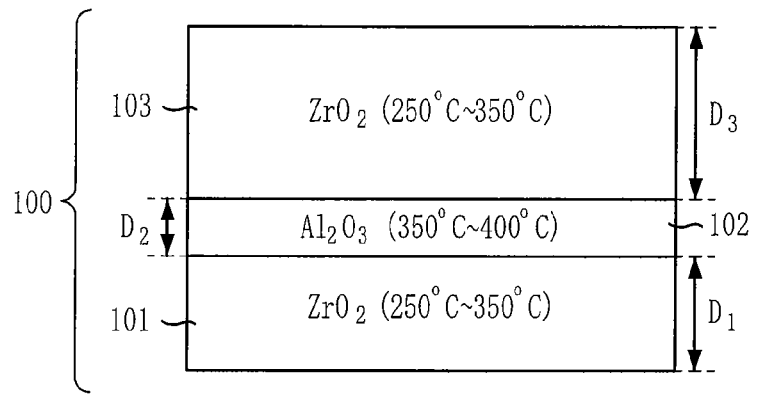
FIG. 3 illustrates a diagram showing a structure of a dielectric layer of a capacitor in accordance with an embodiment of the present invention.
Figure 4:
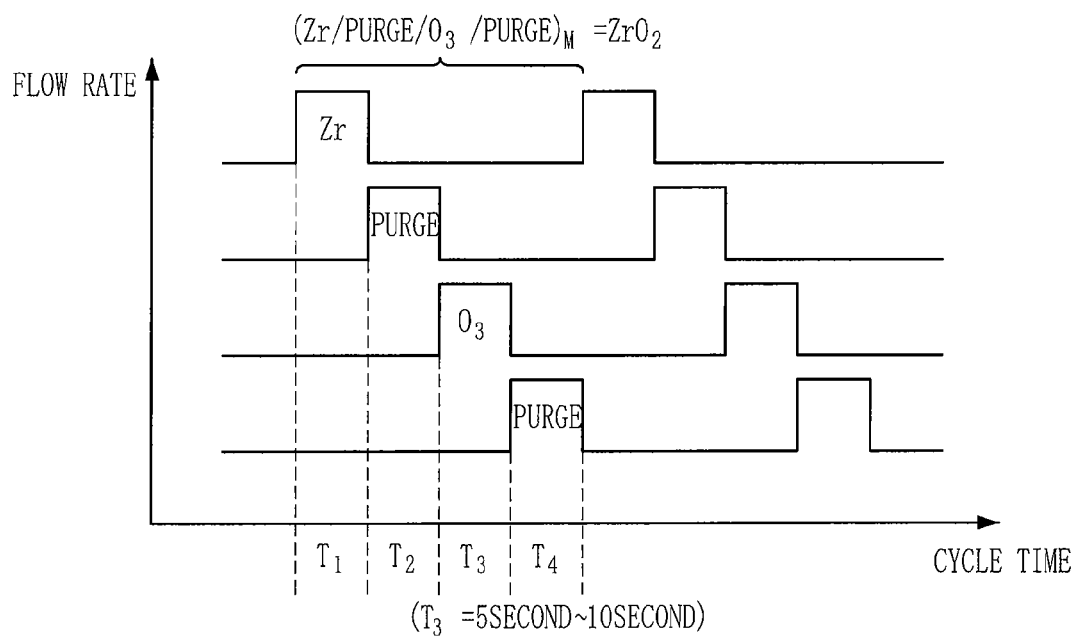
FIG. 4 illustrates a diagram showing an atomic layer deposition cycle of a zirconium oxide layer.
Figure 5:
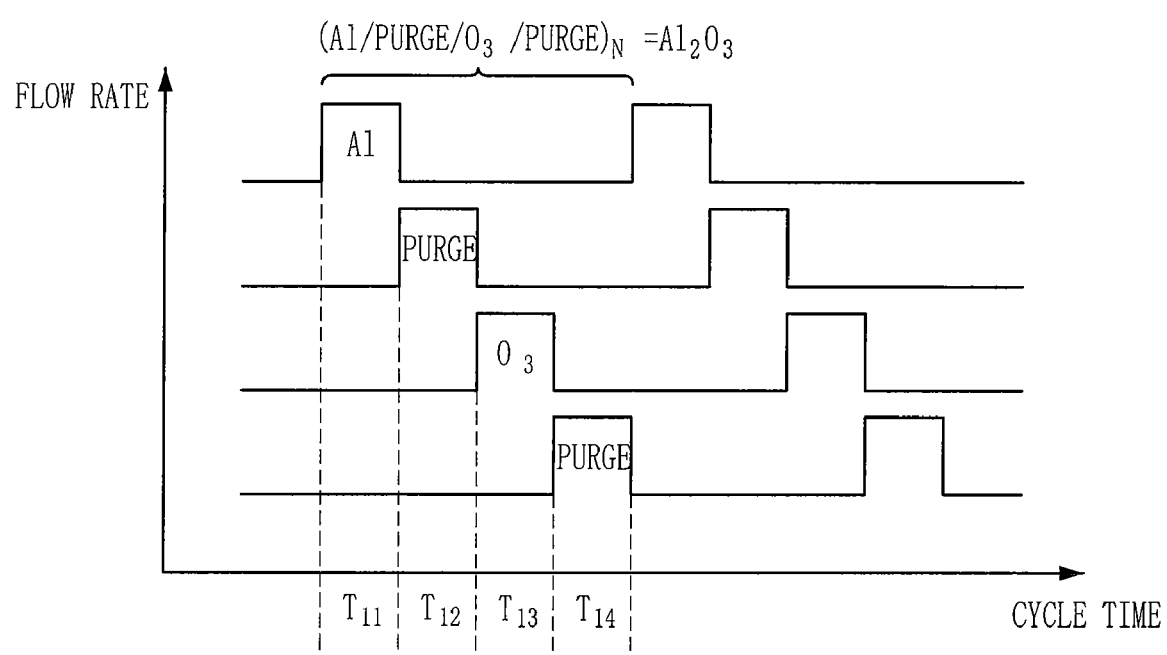
FIG. 5 illustrates a diagram showing an atomic layer deposition cycle of an aluminum oxide layer.

FIG. 3 illustrates a diagram showing a structure of a dielectric layer of a capacitor in accordance with an embodiment of the present invention. FIG. 4 illustrates a diagram showing an atomic layer deposition cycle of a zirconium oxide layer. FIG. 5 illustrates a diagram showing an atomic layer deposition cycle of an aluminum oxide layer.

Referring to FIG. 3, a dielectric layer 100 of a capacitor includes a triple-layer structure configured with a high-k dielectric material (a first dielectric layer 101), a low-k dielectric material (a second dielectric layer 102), and another high-k dielectric material (a third dielectric layer 103) formed in an atomic layer deposition (ALD) chamber in-situ.

The high-k materials used as the first and third dielectric layers 101 and 103 may each include one selected from a group consisting of hafnium oxide ($HfO_2$), zirconium oxide ($ZrO_2$), titanium oxide ($TiO_2$), tantalum oxide ($Ta_2O_5$), and strontium titanate ($SrTiO_3$). The second dielectric layer 102 may include an aluminum oxide ($Al_2O_3$) layer. Hereinafter, the first and third dielectric layers 101 and 103 include $ZrO_2$ and the second dielectric layer 102 includes $Al_2O_3$ as an example. Thus, the first to third dielectric layers 101, 102 and 103 are referred to as a first $ZrO_2$ layer 101, an $Al_2O_3$ layer 102, and a second $ZrO_2$ layer 103, respectively. Therefore, the dielectric layer 100 includes the triple-layer structure configured with the first $ZrO_2$ layer 101, the $Al_2O_3$ layer 102, and the second $ZrO_2$ layer 103.

Referring to FIG. 4, the first and second $ZrO_2$ layers 101 and 103 are formed as described below. The first and second $ZrO_2$ layers 101 and 103 are formed using an ALD method which has a sufficient step coverage characteristic. Although it will be described in detail later, the step coverage characteristic may be further improved when the first and second $ZrO_2$ layers 101 and 103 are formed at a low temperature ranging from approximately 250° C. to approximately 350° C.

The ALD method of the first and second $ZrO_2$ layers 101 and 103 includes repeatedly performing a unit cycle for M number of times (refer to zirconium (Zr)/purge/ozone ($O_3$)/purge shown in FIG. 4). The unit cycle includes a Zr source implantation step $T_1$, a purge gas implantation step $T_2$, a reaction gas implantation step $T_3$, and another purge gas implantation step $T_4$. The unit cycle is performed using a chamber pressure ranging from approximately 0.1 Torr to approximately 10 Torr and a low temperature ranging from approximately 250° C. to approximately 350° C.

The Zr source implantation step $T_1$ includes adsorbing a Zr source. One Zr source selected from a group consisting of $Zr[NC_2H_5CH_3]_4$, $Zr[N(CH_3)_2]_4$, $Zr[OC(CH_3)_2CH_2OCH_3]_4$, $Zr[OC(CH_3)_3]_4$, $ZrCl_4$, and $ZrI_4$ may flow for approximately 2 seconds to approximately 10 seconds.

The purge gas implantation step $T_2$ includes purging the remaining non-adsorbed Zr source. A purge gas may include nitrogen ($N_2$) gas and may flow for approximately 2 seconds to approximately 10 seconds.

The reaction gas implantation step $T_3$ includes implanting a reaction gas to form $ZrO_2$ of an atomic layer unit through a reaction with the adsorbed Zr source. The reaction gas may include $O_3$ and may flow for approximately 5 seconds to approximately 10 seconds. The reaction gas may include $O_2$ plasma. The $O_3$ may flow at a rate ranging from approximately 1,500 sccm to approximately 3,000 sccm. The flowing time (also referred to as a feeding time) of the reaction gas including $O_3$ may include a period of time ranging from approximately 5 seconds to approximately 10 second to improve a layer property and crystallization of $ZrO_2$.

The other purge gas implantation step $T_4$ includes purging reaction by-products and non-reacted reaction gas. The purge gas may include $N_2$ gas and may flow for approximately 2 seconds to approximately 5 seconds.

The aforementioned unit cycle is repeatedly performed to form the first and second $ZrO_2$ layers 101 and 103 (FIG. 3), each having a certain thickness. In this embodiment, the first $ZrO_2$ layer 101 and the second $ZrO_2$ layer 103 are formed to different thicknesses. For instance, a thickness $D_1$ (FIG. 3) of the first $ZrO_2$ layer 101 may be smaller than a thickness $D_3$ (FIG. 3) of the second $ZrO_2$ layer 103. Comparison between the thicknesses will be described later.

Referring to FIG. 5, the $Al_2O_3$ layer 102 is formed as described below. The $Al_2O_3$ layer 102 is formed using an ALD method having a sufficient step coverage characteristic, like the first and second $ZrO_2$ layers 101 and 103.

The ALD method of the $Al_2O_3$ layer 102 includes repeatedly performing a unit cycle for N number of times (refer to Al/purge/$O_3$/purge shown in FIG. 5). The unit cycle includes an aluminum (Al) source implantation step $T_{11}$, a purge gas implantation step $T_{12}$, a reaction gas implantation step $T_{13}$, and another purge gas implantation step $T_{14}$. The unit cycle is performed using a chamber pressure ranging from approximately 0.1 Torr to approximately 10 Torr and a temperature of approximately 400° C. or lower, i.e., ranging between approximately 350° C. and approximately 400° C. The temperature of approximately 400° C. or lower may be the highest temperature which can reduce the chances of cylinders sticking together. Also, the temperature of approximately 400° C. is higher than the temperatures used in forming the first and second $ZrO_2$ layers 101 and 103. Accordingly, forming the $Al_2O_3$ layer 102 at the temperature of approximately 400° C. or lower, which is higher than the deposition temperature of the first $ZrO_2$ layer 101, may induce crystallization of the first $ZrO_2$ layer 101 formed below the $Al_2O_3$ layer 102. Furthermore, an excessive crystallization of the first $ZrO_2$ layer 101 may be avoided since the temperature is not higher than approximately 400° C.

The Al source implantation step $T_{11}$ includes adsorbing an Al source. The Al source may include trimethylaluminum ($Al(CH_3)_3$) and may flow for approximately 0.1 second to approximately 5 seconds.

The purge gas implantation step $T_{12}$ includes purging the remaining non-adsorbed Al source. The purge gas may include $N_2$ gas and may flow for approximately 0.1 second to approximately 5 seconds.

The reaction gas implantation step $T_{13}$ includes implanting a reaction gas to form $Al_2O_3$ of an atomic layer unit through a reaction with the adsorbed Al source. The reaction gas may include $O_3$ and may flow for approximately 0.1 second to approximately 5 seconds. The reaction gas may include $O_2$ plasma.

The other purge gas implantation step $T_{14}$ includes purging reaction by-products and non-reacted reaction gas. The purge gas may include $N_2$ and may flow for approximately 0.1 second to approximately 5 seconds.

The aforementioned unit cycle is repeatedly performed to form the $Al_2O_3$ layer 102 having a thickness ranging from approximately 3 Å to approximately 10 Å. The excessive crystallization of the first $ZrO_2$ layer 101 may be avoided by forming the $Al_2O_3$ layer 102 including the low-k dielectric material at the temperature ranging from approximately 350° C. to approximately 400° C. The leakage current characteristic may be maintained and a high capacitance may be obtained because the $Al_2O_3$ layer 102 is formed to a small thickness of approximately 10 Å or less.

According to the aforementioned embodiment of this invention, the $Al_2O_3$ layer 102 is formed at the temperature of approximately 400° C. or lower when applying the dielectric layer 100 including the triple-layer structure of $ZrO_2/Al_2O_3/ZrO_2$ configured with the first $ZrO_2$ layer 101, the $Al_2O_3$ layer 102, and the second $ZrO_2$ layer 103. Thus, the excessive crystallization of the first $ZrO_2$ layer 101 may be avoided, reducing the chances of the cylinders sticking together. Also, when the second $ZrO_2$ layer 103 is formed, the condition and thickness of the first and second $ZrO_2$ layers 101 and 103 may be optimized in order to compensate for the capacitance decrease of the $Al_2O_3$ layer 102 due to the decreasing deposition temperature.

Referring to FIG. 3, the thickness $D_1$ of the first $ZrO_2$ layer 101 may be smaller than the thickness $D_3$ of the second $ZrO_2$ layer 103. The thickness $D_1$ of the first $ZrO_2$ layer 101 may be larger than the thickness $D_2$ of the $Al_2O_3$ layer 102. That is, a thickness ratio of the triple-layer dielectric layer 100 may be asymmetrical.

For instance, the thickness $D_1$ of the first $ZrO_2$ layer 101 may be approximately 30 Å or greater (e.g., 30 Å $\leq D_1 <$ 60 Å), and the thickness $D_3$ of the second $ZrO_2$ layer 103 may be approximately 60 Å or greater (e.g., $D_3 \geq$ 60 Å). The thickness $D_2$ of the $Al_2O_3$ layer 102 may be approximately 2 Å or greater (e.g., 2 Å $\leq D_2 <$ 10 Å). Thus, the ratio of the minimum thicknesses of the first $ZrO_2$ layer 101 to the $Al_2O_3$ layer 102 to the second $ZrO_2$ layer 103 may be approximately 15 (30 Å):1 (2 Å):30 (60 Å).

Examples of the thickness combinations may include asymmetric thickness ratios such as 65 Å/5 Å/51 Å, 65 Å/4 Å/51 Å, 65 Å/4 Å/49 Å, 65 Å/3 Å/49 Å, and 65 Å/3 Å/46 Å. In the examples, the thickness (65 Å) of the second $ZrO_2$ layer 103 is larger than the thickness (51 Å) of the first $ZrO_2$ layer 101.

Increasing the thickness of the second $ZrO_2$ layer 103 may complement the leakage current characteristic. For example, layer property of a plate electrode may be poor when compared to a storage electrode because the plate electrode is formed at a low temperature when fabricating a capacitor. Thus, the leakage current characteristic of an interface between the second $ZrO_2$ layer 103 and the plate electrode may be further deteriorated. The leakage current characteristic may be improved by increasing the thickness of the second $ZrO_2$ layer 103 contacting the plate electrode.

Referring to FIG. 4, the capacitance decrease due to the decreased deposition temperature of the $Al_2O_3$ layer 102 may be avoided by reinforcing deposition cycle times of the first and second $ZrO_2$ layers 101 and 103. That is, although deposition cycle times of tetrakis methylethylamino zirconium (TEMAZ)/$N_2$/$O_3$/$N_2$=4/4/3/3 seconds have been typically used, a cycle time (also referred to as a feeding time) of the reaction gas $O_3$ is increased to approximately 5 seconds to approximately 10 seconds in order to improve the layer property and crystallization of $ZrO_2$. Thus, increasing the feeding time of the $O_3$ in the deposition cycle times of $ZrO_2$ improves the layer property deteriorated by the low deposition temperature, and also increases the dielectric constant by improving the crystalline property of $ZrO_2$.

When forming a multiple-layer dielectric layer as described above, the high-k dielectric material ($ZrO_2$) may be formed at a low temperature while the feeding time of the reaction gas is increased for optimization. Also, the low-k dielectric material ($Al_2O_3$) used for improving the leakage current characteristic may be formed using the highest temperature which does not cause the cylinders to stick together (approximately 400° C. or lower). The thickness ratio of the first and second $ZrO_2$ layers 101 and 103 and the $Al_2O_3$ layer 102 is optimized.

Thus, a dielectric layer of a capacitor which can avoid the dual bit failures and obtain high capacitance may be fabricated by controlling the feeding times, the thicknesses, and the deposition temperatures, even if the spacing distance between the adjacent storage electrodes becomes small.

The dielectric layer having the triple-layer structure applicable in this embodiment of the present invention may include $HfO_2/Al_2O_3/HfO_2$, $TiO_2/Al_2O_3/TiO_2$, $Ta_2O_5/Al_2O_3/Ta_2O_5$, or $SrTiO_3/Al_2O_3/SrTiO_3$. The thickness ratio of the dielectric layers configuring the triple-layer structure may be asymmetrical. The $Al_2O_3$ may be formed at a temperature of approximately 400° C. or lower. The $HfO_2$, the $TiO_2$, the $Ta_2O_5$, and the $SrTiO_3$ may be formed at a low temperature ranging from approximately 250° C. to approximately 350° C. Also, the high-k dielectric materials formed over and below the $Al_2O_3$ may include substantially the same material or different materials from each other.

FIGS. 6A to 6D illustrate cross-sectional views of a method for fabricating a capacitor in accordance with an embodiment of the present invention.

Figure 6A:
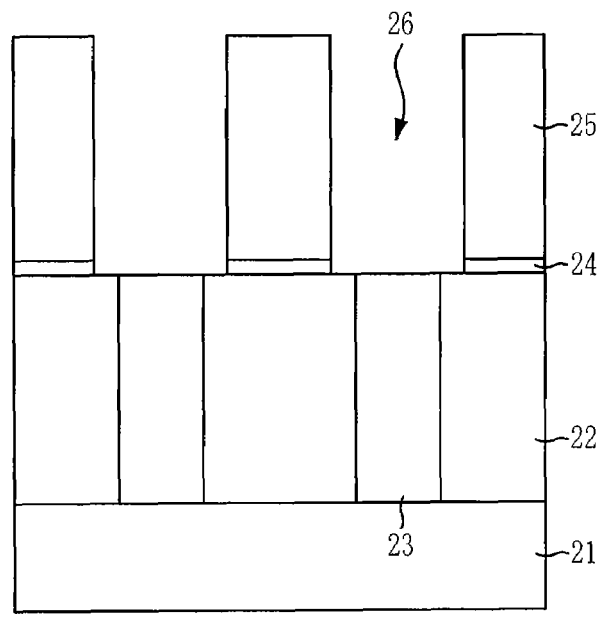
FIGS. 6A to 6D illustrate cross-sectional views of a method for fabricating a capacitor in accordance with an embodiment of the present invention.

Referring to FIG. 6A, an insulation layer 22 is formed over a semi-finished substrate 21 including word lines and bit lines (not shown). The insulation layer 22 includes contact holes. A planarization process using a chemical mechanical polishing (CMP) process may be performed on the insulation layer 22 to lessen differences in heights generated by bottom structures.

Storage node contact plugs 23 are filled into the contact holes. At this time, the storage node contact plugs 23 may include a stack structure configured with a polysilicon plug and a barrier metal. The polysilicon plug may be formed by forming a polysilicon layer and then performing an etch-back process. A surface of the polysilicon plug is recessed by the etch-back process. The barrier metal is formed by forming titanium (Ti)/titanium nitride (TiN) over the substrate structure and then performing a CMP process or an etch-back process. Thus, the storage node contact plugs 23 including the stack structure configured with the polysilicon plug and the barrier metal are formed in the contact holes.

A patterned etch stop layer 24 and a patterned sacrificial layer 25 are formed over the resultant substrate structure. The patterned etch stop layer 24 includes silicon nitride (SiN), and the patterned sacrificial layer 25 includes an oxide-based material such as phosphosilicate glass (PSG) and plasma enhanced tetraethyl orthosilicate (PETEOS).

In more detail, an etch stop layer and a sacrificial layer are formed over the substrate structure. The etch stop layer and the sacrificial layer are sequentially etched to form open regions 26 exposing the storage node contact plugs 23. At this time, the sacrificial layer is etched until the etching stops at the etch stop layer and then the etch stop layer is etched, forming the patterned etch stop layer 24 and the patterned sacrificial layer 25. The open regions 26 have a three-dimensional structure in which storage electrodes of the capacitor will be formed.

Figure 6B:
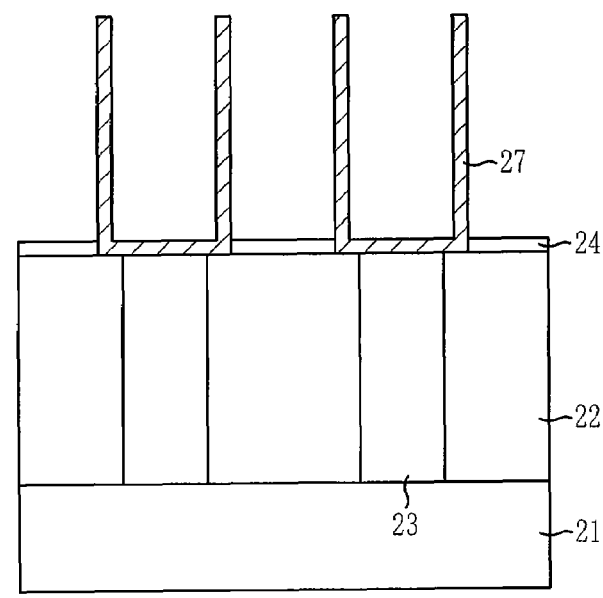

Referring to FIG. 6B, a storage electrode material is formed over the substrate structure, and then a storage electrode isolation process is performed. The storage electrode material may include a metal material selected from a group consisting of ruthenium (Ru), TiN, platinum (Pt), iridium (Ir), hafnium nitride (HfN), and a combination thereof. The storage electrode isolation process includes isolating adjacent storage electrodes 27 by selectively removing the metal material formed over the surfaces of the patterned sacrificial layer 25 outside the open regions 26. The storage electrode isolation process may include a CMP process or an etch-back process. The storage electrodes 27 obtain a cylinder form through the storage electrode isolation process.

The patterned sacrificial layer 25 is removed using a full dip out process. At this time, the full dip out process may use a wet chemical because the patterned sacrificial layer 25 includes the oxide-based material. For instance, the wet chemical may include a buffered oxide etchant (BOE) solution or a hydrogen fluoride (HF) solution. Exposed surfaces of the storage electrodes 27 are cleaned using HF or BOE.

Figure 6C:
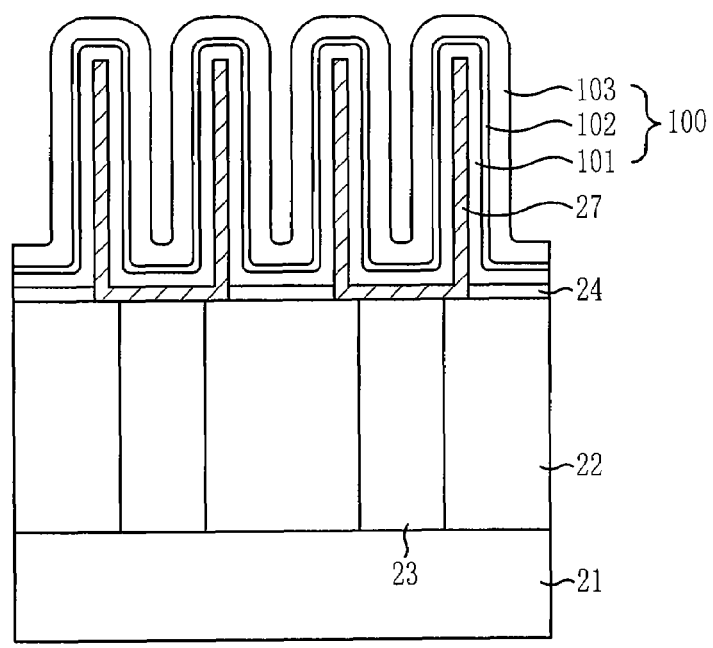

Referring to FIG. 6C, a dielectric layer 100 is formed over the resultant substrate structure. The dielectric layer 100 includes a triple-layer structure configured with a first high-k dielectric material, $Al_2O_3$, and a second high-k dielectric material formed in an atomic layer deposition (ALD) chamber in-situ. The first and second high-k dielectric materials may each include one selected from a group consisting of $HfO_2$, $ZrO_2$, $TiO_2$, $Ta_2O_5$, and $SrTiO_3$.

Hereinafter, the dielectric layer 100 includes a triple-layer structure configured with a first $ZrO_2$ layer 101, an $Al_2O_3$ layer 102, and a second $ZrO_2$ layer 103 as an example. Methods to form these layers are described in FIGS. 4 and 5. When forming the triple-layer structure of $ZrO_2/Al_2O_3/ZrO_2$ configured with the first $ZrO_2$ layer 101, the $Al_2O_3$ layer 102, and the second $ZrO_2$ layer 103, the first and second $ZrO_2$ layers 101 and 103 are formed at a temperature ranging from approximately 250° C. to approximately 350° C. and the $Al_2O_3$ layer 102 is formed at a temperature of approximately 400° C. or lower. Thus, an excessive crystallization of the first $ZrO_2$ layer 101 may be avoided and cylinders may not stick together even if a spacing distance between the cylinders becomes small. Conditions of the process and deposition thicknesses of the first and second $ZrO_2$ layers 101 and 103 are optimized to compensate for a capacitance decrease in the $Al_2O_3$ layer 102 generated by the decreased temperature when forming the second $ZrO_2$ layer 103.

A thickness of the first $ZrO_2$ layer 101 is smaller than a thickness of the second $ZrO_2$ layer 103. The thickness of the first $ZrO_2$ layer 101 is larger than a thickness of the $Al_2O_3$ layer 102. That is, a thickness ratio of the triple-layer dielectric layer 100 is asymmetrical. For instance, the thickness (refer to $D_1$ in FIG. 3) of the first $ZrO_2$ layer 101 may be approximately 30 Å or greater (e.g., $30 Å \leq D_1 < 60 Å$), and the thickness (refer to $D_3$ in FIG. 3) of the second $ZrO_2$ layer 103 may be approximately 60 Å or greater (e.g., $D_3 \geq 60 Å$). The thickness (refer to $D_2$ in FIG. 3) of the $Al_2O_3$ layer 102 may be approximately 2 Å or greater (e.g., $2 Å \leq D_2 < 10 Å$). Thus, the ratio of the minimum thicknesses of the first $ZrO_2$ layer 101 to the $Al_2O_3$ layer 102 to the second $ZrO_2$ layer 103 may be approximately 15 (30 Å):1 (2 Å):30 (60 Å). For instance, an asymmetric thickness ratio of approximately 65 Å/5 Å/51 Å may be applied to the thicknesses of each layers.

Accordingly, increasing the thickness of the second $ZrO_2$ layer 103 may compensate for the leakage current characteristic. For instance, a plate electrode is formed at a low temperature when forming a capacitor. Thus, the plate electrode has a low layer property when compared to a storage electrode, causing a further deteriorated leakage current characteristic of an interface between a second $ZrO_2$ layer and the plate electrode. In this embodiment, the thickness of the second $ZrO_2$ layer 103 contacting a plate electrode is increased to improve the leakage current characteristic.

The capacitance decrease caused by the decreased deposition temperature of the $Al_2O_3$ layer 102 may be avoided by reinforcing the deposition cycle times of the first and second $ZrO_2$ layers 101 and 103. A cycle time (also referred to as a feeding time) of a reaction gas $O_3$ is increased to approximately 5 seconds to approximately 10 seconds in order to improve the layer property and crystallization of $ZrO_2$. Thus, increasing the feeding time of the $O_3$ in the deposition cycle times of $ZrO_2$ improves the layer property deteriorated by the low deposition temperature, and also increases the dielectric constant by improving the crystalline property of $ZrO_2$.

When forming a multiple-layer dielectric layer as described above, the high-k dielectric material ($ZrO_2$) may be formed at a low temperature while the feeding time of the reaction gas is increased for optimization. Also, the amorphous low-k dielectric material ($Al_2O_3$) used for improving the leakage current characteristic may be formed at the highest temperature (approximately 400° C. or lower) which does not cause the cylinders to stick together. By optimizing the thickness ratio of the first and second $ZrO_2$ layers and the $Al_2O_3$ layer, a dielectric layer of a capacitor which can avoid dual bit failures and obtain high capacitance may be fabricated.

A dielectric layer having the triple-layer structure applicable in this embodiment of the present invention may include $HfO_2/Al_2O_3/HfO_2$, $TiO_2/Al_2O_3/TiO_2$, $Ta_2O_5/Al_2O_3/Ta_2O_5$, or $SrTiO_3/Al_2O_3/SrTiO_3$. A thickness ratio of the dielectric layers may be asymmetrical in the dielectric layer having the triple-layer structure. The $Al_2O_3$ may be formed at a temperature of approximately 400° C. or lower. The $HfO_2$, the $TiO_2$, the $Ta_2O_5$, and $SrTiO_3$ may be formed at a low temperature ranging from approximately 250° C. to approximately 350° C.

Figure 6D:
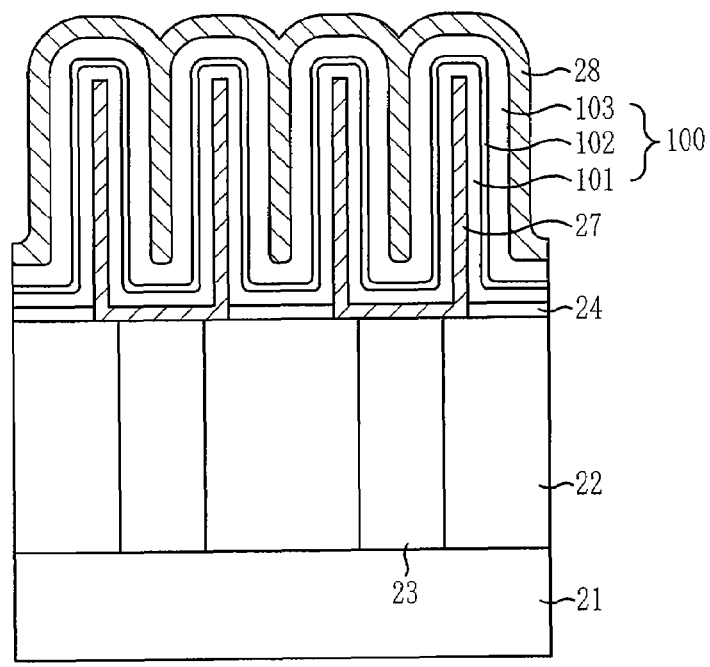

Referring to FIG. 6D, a plate electrode 28 is formed over the dielectric layer 100. At this time, the plate electrode 28 may include polysilicon doped with N-type impurities or a metal electrode. The metal electrode may include TiN, Ru, Pt, Ir, or HfN.

Figure 7:
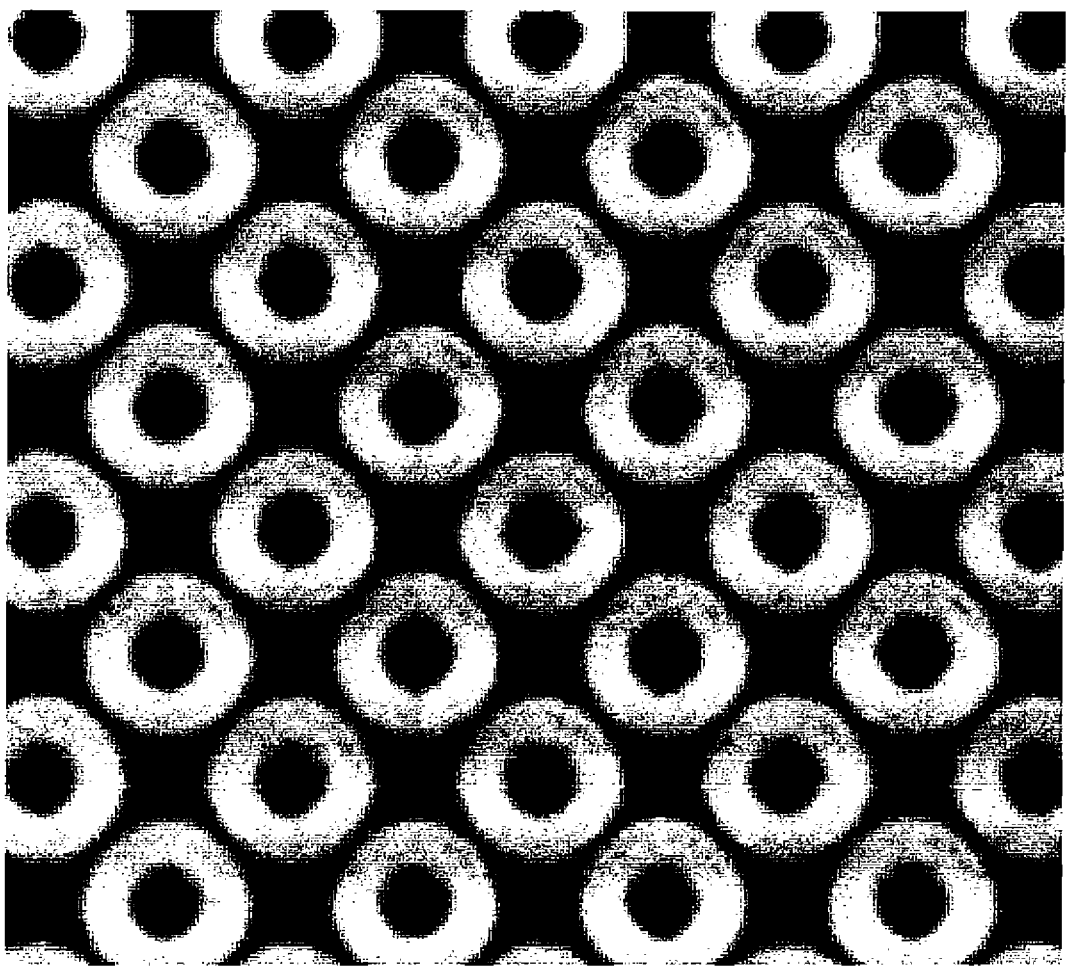
FIG. 7 illustrates a micrographic view of a result after an $Al_2O_3$ layer is formed in accordance with an embodiment of the present invention.

FIG. 7 illustrates a micrographic view of a result after an $Al_2O_3$ layer is formed in accordance with an embodiment of the present invention. Adjacent cylinders in a bottom electrode structure disposed in a zigzag pattern do not stick together even when a spacing distance is small between bottom electrodes. This result may be achieved because the $Al_2O_3$ layer is formed at a temperature of approximately 400° C. or lower, reducing an excessive crystallization of a first $ZrO_2$ layer.

While the present invention has been described with respect to the specific embodiments, it will be apparent to those skilled in the art that various changes and modifications may be made without departing from the spirit and scope of the invention as defined in the following claims.

What is claimed is:

1. A dielectric layer of a capacitor, comprising:
a first dielectric layer consisting essentially of zirconium oxide ($ZrO_2$);
a second dielectric layer consisting essentially of aluminum oxide ($Al_2O_2$) formed over the first dielectric layer, the second dielectric layer having a dielectric constant lower than that of the first dielectric layer, wherein the second dielectric layer has a thickness that is less than a thickness of the first dielectric layer; and
a third dielectric layer consisting essentially of zirconium oxide ($ZrO_2$) formed over the second dielectric layer, the third dielectric layer having a dielectric constant higher than that of the second dielectric layer, wherein the third dielectric layer has a greater thickness than each of the first and second dielectric layer, wherein the thickness of the first dielectric layer is approximately 30 Å or greater and less than approximately 60 Å, the thickness of the third dielectric layer is approximately 60 Å or greater, and the thickness of the second dielectric layer is approximately 2 Å or greater and less than approximately 10 Å.

2. The dielectric layer of claim 1, wherein the first and third dielectric layers are formed using an atomic layer deposition (ALD) method at a temperature ranging from approximately 250° C. to approximately 350° C., and the second dielectric layer is formed using an ALD method at a temperature of approximately 400° C. or lower.

3. A method for fabricating a dielectric layer of a capacitor, comprising:
forming a first dielectric layer consisting essentially of zirconium oxide ($ZrO_2$);
forming a second dielectric layer consisting essentially of aluminum oxide ($Al_2O_2$) over the first dielectric layer, the second dielectric layer having a dielectric constant lower than that of the first dielectric layer, wherein the second dielectric layer has a thickness that is less than a thickness of the first dielectric layer; and
forming a third dielectric layer consisting essentially of zirconium oxide ($ZrO_2$) over the second dielectric layer, the third dielectric layer having a dielectric constant higher than that of the second dielectric layer, wherein the third dielectric layer is thicker than each of the first and second dielectric layers, wherein the thickness of the first dielectric layer is approximately 30 Å or greater and less than approximately 60 Å, the thickness of the third dielectric layer is approximately 60 Å or greater, and the thickness of the second dielectric layer is approximately 2 Å or greater and less than approximately 10 Å.

4. The method of claim 3, wherein the first to third dielectric layers are formed in an atomic layer deposition (ALD) chamber.

5. The method of claim 4, wherein the first to third dielectric layers are formed in-situ in the ALD chamber.

6. The method of claim 3, wherein the $ZrO_2$ is formed at a temperature ranging from approximately 250° C. to approximately 350° C. and the $Al_2O_3$ is formed at a temperature of approximately 400° C. or lower.

7. The method of claim 5, wherein an ALD method for forming the $ZrO_2$ comprises repeatedly performing a process including:
providing a zirconium source;
providing a purge gas;
providing a reaction gas; and
providing a purge gas.

8. The method of claim 7, wherein a feeding time of the reaction gas ranges from approximately 5 seconds to approximately 10 seconds.

9. The method of claim 7, wherein the reaction gas comprises one of ozone ($O_3$) and oxygen ($O_2$) plasma, and the $O_3$ flows at a rate ranging from approximately 1,500 sccm to approximately 3,000 sccm.

10. The method of claim 7, wherein the zirconium source comprises one selected from a group consisting of $Zr[NC_2H_5CH_3]_4$, $Zr[N(CH_3)_2]_4$, $Zr[OC(CH_3)_2CH_2OCH_3]_4$, $Zr[OC(CH_3)_3]_4$, $ZrCl_4$, and $ZrI_4$.

11. A method for fabricating a capacitor, comprising:
forming a storage electrode;
forming a first dielectric layer consisting essentially of zirconium oxide ($ZrO_2$) over the storage electrode;
forming a second dielectric layer consisting essentially of aluminum oxide ($Al_2O_2$) over the first dielectric layer, the second dielectric layer having a dielectric constant lower than that of the first dielectric layer, wherein the second dielectric layer has a thickness that is less than a thickness of the first dielectric layer;
forming a third dielectric layer consisting essentially of zirconium oxide ($ZrO_2$) over the second dielectric layer, the third dielectric layer having a dielectric constant higher than that of the second dielectric layer and having a thickness greater than that of each of the first and second dielectric layers; and
forming a plate electrode over the third dielectric layer, wherein the thickness of the first dielectric layer is approximately 30 Å or greater and less than approximately 60 Å, the thickness of the third dielectric layer is approximately 60 Å or greater, and the thickness of the second dielectric layer is approximately 2 Å or greater and less than approximately 10 Å.

12. The method of claim 11, wherein the first to third dielectric layers are formed in an atomic layer deposition (ALD) chamber.

13. The method of claim 12, wherein the first to third dielectric layers are formed in-situ in the ALD chamber.

14. The method of claim 13, wherein the $ZrO_2$ is formed at a temperature ranging from approximately 250° C. to approximately 350° C. and the $Al_2O_3$ is formed at a temperature of approximately 400° C. or lower.

15. The method of claim 13, wherein an ALD method for forming the $ZrO_2$ comprises repeatedly performing a unit cycle including:

providing a zirconium source;
providing a purge gas;
providing a reaction gas; and
providing a purge gas.

16. The method of claim 15, wherein a feeding time of the reaction gas ranges from approximately 5 seconds to approximately 10 seconds.

17. The method of claim 15, wherein the reaction gas comprises one of ozone ($O_3$) and oxygen ($O_2$) plasma, and the $O_3$ flows at a rate ranging from approximately 1,500 sccm to approximately 3,000 sccm.

18. The method of claim 15, wherein the zirconium source comprises one selected from a group consisting of $Zr[NC_2H_5CH_3]_4$, $Zr[N(CH_3)_2]_4$, $Zr[OC(CH_3)_2CH_2OCH_3]_4$, $Zr[OC(CH_3)_3]_4$, $ZrCl_4$, and $ZrI_4$.

19. The method of claim 11, wherein the storage electrode has a cylinder form.

* * * * *